(12) United States Patent
Feng

(10) Patent No.: US 12,082,432 B2
(45) Date of Patent: Sep. 3, 2024

(54) QUANTUM DOT LIGHT-EMITTING DEVICE, PREPARING METHOD AND DISPLAY DEVICE

(71) Applicant: BOE Technology Group Co., Ltd., Beijing (CN)

(72) Inventor: Jingwen Feng, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 456 days.

(21) Appl. No.: 17/436,035

(22) PCT Filed: Feb. 25, 2021

(86) PCT No.: PCT/CN2021/077926
§ 371 (c)(1),
(2) Date: Sep. 2, 2021

(87) PCT Pub. No.: WO2021/170044
PCT Pub. Date: Sep. 2, 2021

(65) Prior Publication Data
US 2022/0006033 A1 Jan. 6, 2022

(30) Foreign Application Priority Data
Feb. 27, 2020 (CN) .......................... 202010125088.5

(51) Int. Cl.
*H10K 50/115* (2023.01)
*H10K 71/00* (2023.01)

(52) U.S. Cl.
CPC ........... *H10K 50/115* (2023.02); *H10K 71/00* (2023.02)

(58) Field of Classification Search
CPC .............................. H10K 50/115; H10K 50/11
See application file for complete search history.

(56) References Cited

U.S. PATENT DOCUMENTS

| 9,773,943 | B1 | 9/2017 | Xie |
| 10,784,457 | B2 * | 9/2020 | Wu ........................ H10K 71/40 |
| 11,818,943 | B2 * | 11/2023 | Kalra ..................... H10K 50/18 |

(Continued)

FOREIGN PATENT DOCUMENTS

| CN | 101405888 A | 4/2009 |
| CN | 101834277 A | 9/2010 |

(Continued)

OTHER PUBLICATIONS

CN 2020101250885 first office action.
PCT/CN2021/077926 international search report and written opinion.

*Primary Examiner* — Mamadou L Diallo
(74) *Attorney, Agent, or Firm* — IPro, PLLC

(57) ABSTRACT

The present disclosure provides a quantum dot light-emitting device, a preparing method and a display device. The quantum dot light-emitting device includes an anode, a hole transport layer, a quantum dot light-emitting layer, an electron transport layer and a cathode laminated one on another. The quantum dot light-emitting layer includes heterodimer quantum dots, the heterodimer quantum dots include first quantum dots carrying a positive charge and second quantum dots carrying a negative charge, and each first quantum dot and each second quantum dot have a same energy gap and different positions of conduction band and valence band.

18 Claims, 2 Drawing Sheets

(56) References Cited

U.S. PATENT DOCUMENTS

| | | | |
|---|---|---|---|
| 2007/0247067 A1* | 10/2007 | Segal | H10K 50/11 |
| | | | 428/917 |
| 2010/0213438 A1 | 8/2010 | Cho et al. | |
| 2010/0320442 A1 | 12/2010 | Reddy | |
| 2012/0132891 A1* | 5/2012 | Pease, III | H01L 21/02521 |
| | | | 257/15 |
| 2016/0351842 A1 | 12/2016 | Park et al. | |
| 2019/0386233 A1 | 12/2019 | Wu et al. | |
| 2020/0058884 A1* | 2/2020 | Park | H10K 50/11 |
| 2020/0083470 A1* | 3/2020 | Chung | H10K 71/00 |
| 2020/0235326 A1* | 7/2020 | Rahmati | H01L 33/06 |
| 2020/0343487 A1* | 10/2020 | Han | H10K 50/13 |
| 2022/0115613 A1* | 4/2022 | Ueta | G09F 9/30 |
| 2022/0238830 A1* | 7/2022 | Ueta | H10K 50/115 |
| 2022/0263039 A1* | 8/2022 | Angioni | H10K 50/818 |
| 2022/0359845 A1* | 11/2022 | Kobashi | H10K 50/16 |
| 2022/0367825 A1* | 11/2022 | Sakakibara | H05B 33/14 |
| 2022/0416186 A1* | 12/2022 | Takenaka | H05B 33/14 |

FOREIGN PATENT DOCUMENTS

| | | | | |
|---|---|---|---|---|
| CN | 101884620 A | * | 11/2010 | |
| CN | 105316697 A | * | 2/2016 | |
| CN | 106816539 A | * | 6/2017 | H01L 33/06 |
| CN | 107833976 A | | 3/2018 | |
| EP | 2221355 A1 | * | 8/2010 | B82Y 20/00 |

\* cited by examiner

QUANTUM DOT LIGHT-EMITTING DEVICE, PREPARING METHOD AND DISPLAY DEVICE

CROSS-REFERENCE TO RELATED APPLICATION

The present application is the U.S. national phase of PCT Application No. PCT/CN2021/077926 filed on Feb. 25, 2021, which claims a priority of the Chinese patent application No. 202010125088.5 filed on Feb. 27, 2020, both disclosures of which are incorporated herein by reference in their entireties.

TECHNICAL FIELD

The present disclosure relates to the field of display technology, in particular to a quantum dot light-emitting device, a preparing method and a display device.

BACKGROUND

A Quantum dot Light-Emitting Diode (QLED) display device is an electroluminescence element, and holes and electrons overcome an interface barrier and enter a valence band energy level and a conduction band energy level of a quantum dot light-emitting layer respectively under the effect of an external electric field, and photons are released when returning from an excited state to a stable ground state.

SUMMARY

In one aspect, the present disclosure provides in some embodiments a quantum dot light-emitting device, including an anode, a hole transport layer, a quantum dot light-emitting layer, an electron transport layer and a cathode laminated one on another. The quantum dot light-emitting layer includes heterodimer quantum dots, the heterodimer quantum dots include first quantum dots carrying a positive charge and second quantum dots carrying a negative charge, and each first quantum dot and each second quantum dot have a same energy gap and different positions of conduction band and valence band.

In a possible embodiment of the present disclosure, the quantum dot light-emitting device further includes a base substrate, and the anode, the hole transport layer, the quantum dot light-emitting layer, the electron transport layer and the cathode are laminated one on another on the base substrate in a direction away from the base substrate.

In a possible embodiment of the present disclosure, the quantum dot light-emitting device further includes a base substrate, and the cathode, the electron transport layer, the quantum dot light-emitting layer, the hole transport layer and the anode are laminated one on another on the base substrate in a direction away from the base substrate.

In a possible embodiment of the present disclosure, the first quantum dots and the second quantum dots are configured to emit light within a same wavelength range.

In a possible embodiment of the present disclosure, the quantum dot light-emitting device further includes a hole injection layer arranged between the anode and the hole transport layer.

In a possible embodiment of the present disclosure, each of the first quantum dots and the second quantum dots includes one or more of a CdS/ZnS quantum dot, a CdSe/ZnS quantum dot, a CdS/ZnSe quantum dot, a CdSe/ZnSe quantum dot, an InP/ZnS quantum dot, a PbS/ZnS quantum dot, a $CsPbCl_3$/ZnS quantum dot or a $CsPbBr_3$/ZnSe quantum dot.

In a possible embodiment of the present disclosure, each first quantum dot in the quantum dot light-emitting layer carries a cationic surfactant, and each second quantum dot in the quantum dot light-emitting layer carries an anionic surfactant.

In a possible embodiment of the present disclosure, light emitted by the quantum dot light-emitting layer exits through the base substrate, or exits in a direction away from the base substrate.

In another aspect, the present disclosure provides in some embodiments a method for preparing a heterodimer quantum dot, including: acquiring first quantum dots and second quantum dots, each first quantum dot and each second quantum dot having a same energy gap and different positions of conduction band and valence band; enabling each first quantum dot to carry a positive charge and enabling each second quantum dot to carry a negative charge; and mixing the first quantum dots carrying the positive charge and the second quantum dots carrying the negative charge to acquire the heterodimer quantum dot.

In a possible embodiment of the present disclosure, the acquiring the first quantum dots and the second quantum dots includes: forming the first quantum dots carrying a first elementary composition in a first synthesis condition; and forming the second quantum dots carrying a second elementary composition in a second synthesis condition. Elements in the first elementary composition are the same as elements in the second elementary composition, or at least one element in the first elementary composition is different from the elements in the second elementary composition.

In a possible embodiment of the present disclosure, the enabling each first quantum dot to carry the positive charge and enabling each second quantum dot to carry the negative charge includes: forming a colloid of the first quantum dots, and adding a cationic surfactant into the colloid of the first quantum dots to acquire the first quantum dots carrying the positive charge; and forming a colloid of the second quantum dots, and adding an anionic surfactant into the colloid of the second quantum dots to acquire the second quantum dots carrying the negative charge.

In a possible embodiment of the present disclosure, the method further includes washing and purifying the heterodimer quantum dots.

In yet another aspect, the present disclosure provides in some embodiments a method for preparing a quantum dot light-emitting device, including forming an anode, a hole transport layer, a quantum dot light-emitting layer, an electron transport layer and a cathode laminated one on another. The quantum dot light-emitting layer includes heterodimer quantum dots, the heterodimer quantum dots include first quantum dots carrying a positive charge and second quantum dots carrying a negative charge, and each first quantum dot and each second quantum dot have a same energy gap and different positions of conduction band and valence band.

In a possible embodiment of the present disclosure, the forming the anode, the hole transport layer, the quantum dot light-emitting layer, the electron transport layer and the cathode laminated one on another includes providing a base substrate, and forming the anode, the hole transport layer, the quantum dot light-emitting layer, the electron transport layer and the cathode laminated one on another on the base substrate.

In a possible embodiment of the present disclosure, the forming the anode, the hole transport layer, the quantum dot light-emitting layer, the electron transport layer and the cathode laminated one on another includes providing a base substrate, and forming the cathode, the electron transport layer, the quantum dot light-emitting layer, the hole transport layer and the anode laminated one on another on the base substrate.

In a possible embodiment of the present disclosure, the first quantum dots and the second quantum dots are configured to emit light within a same wavelength range.

In a possible embodiment of the present disclosure, the forming the anode, the hole transport layer, the quantum dot light-emitting layer, the electron transport layer and the cathode laminated one on another includes forming the anode, a hole injection layer, the hole transport layer, the quantum dot light-emitting layer, the electron transport layer and the cathode laminated one on another.

In a possible embodiment of the present disclosure, the forming the anode, the hole transport layer, the quantum dot light-emitting layer, the electron transport layer and the cathode laminated one on another includes forming the cathode, the electron transport layer, the quantum dot light-emitting layer, the hole transport layer, a hole injection layer and the anode laminated one on another.

In a possible embodiment of the present disclosure, each of the first quantum dots and the second quantum dots includes one or more of a CdS/ZnS quantum dot, a CdSe/ZnS quantum dot, a CdS/ZnSe quantum dot, a CdSe/ZnSe quantum dot, an InP/ZnS quantum dot, a PbS/ZnS quantum dot, a $CsPbCl_3$/ZnS quantum dot or a $CsPbBr_3$/ZnSe quantum dot.

In a possible embodiment of the present disclosure, each first quantum dot in the quantum dot light-emitting layer carries a cationic surfactant, and each second quantum dot in the quantum dot light-emitting layer carries an anionic surfactant.

In still yet another aspect, the present disclosure provides in some embodiments a display device including the above-mentioned quantum dot light-emitting device.

Figure 1:
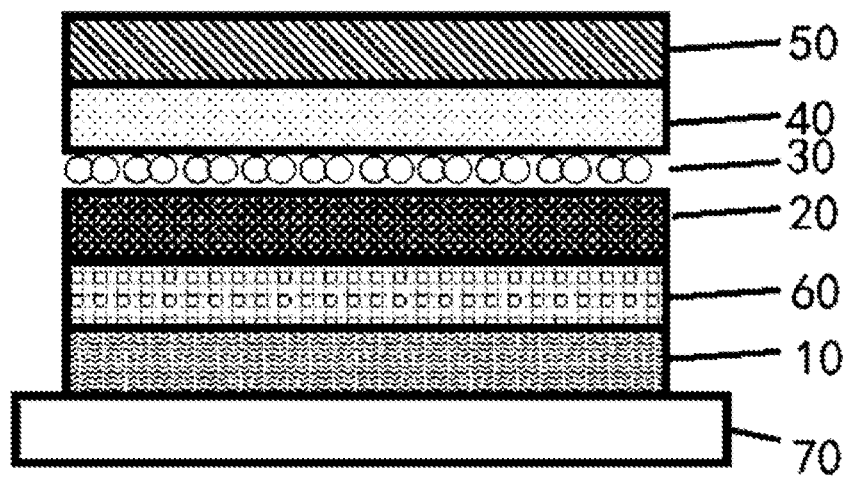
FIG. 1 is a schematic view of a quantum dot light-emitting device according to one embodiment of the present disclosure.

REFERENCE SIGN LIST 10 anode
20 hole transport layer
30 quantum dot light-emitting layer
40 electron transport layer
50 cathode
60 hole injection layer
70 base substrate

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

In a QLED device, usually electron injection is more efficient than hole injection, so there is an imbalance between electrons and holes, and thereby the efficiency and service life of the OLED device will be adversely affected.

In order to solve the above problem, the present disclosure provides in some embodiments a quantum dot light-emitting device.

Figure 2:
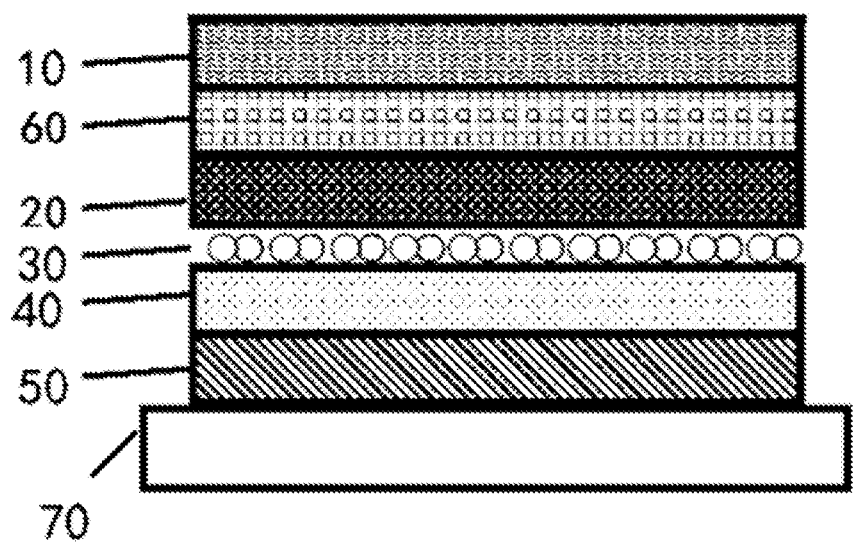
FIG. 2 is another schematic view of the quantum dot light-emitting device according to one embodiment of the present disclosure.
Figure 3:
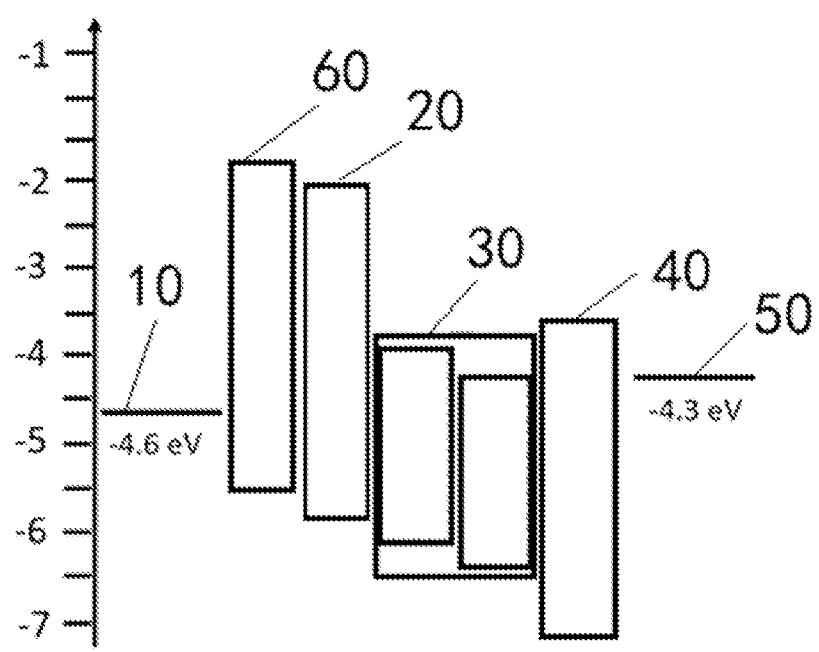
FIG. 3 is a schematic view showing an energy level structure of the quantum dot light-emitting device according to one embodiment of the present disclosure.

As shown in FIGS. 1 to 3, the quantum dot light-emitting device includes an anode 10, a hole transport layer 20, a quantum dot light-emitting layer 30, an electron transport layer 40 and a cathode 50 laminated one on another. The quantum dot light-emitting layer 30 includes heterodimer quantum dots, the heterodimer quantum dots include first quantum dots carrying a positive charge and second quantum dots carrying a negative charge, and each first quantum dot and each second quantum dot have a same energy gap and different positions of conduction band and valence band.

In other words, the quantum dot light-emitting device mainly consists of the anode 10, the hole transport layer 20, the quantum dot light-emitting layer 30, the electron transport layer 40 and the cathode 50. The anode 10 is arranged on a base substrate 70, and the base substrate 70 is a transparent glass substrate. The anode 10 is made of Indium Tin Oxide (ITO), and holes are generated through the anode 10. The hole transport layer 20 is arranged on the anode 10, and the quantum dot light-emitting layer 30 is arranged on the hole transport layer 20. The holes are transported through the hole transport layer 20 to the quantum dot light-emitting layer 30. The electron transport layer 40 is arranged on the quantum dot light-emitting layer 30, and it is made of Zinc Oxide (ZnO) or Zinc Magnesium Oxide (ZnMgO). The cathode 50 is arranged on the electron transport layer 40, and it is made of Aluminium (Al), or Magnesium (Mg)/Argentum (Ag). Electrons are generated through the cathode 50, and then transported through the electron transport layer 40 to the quantum dot light-emitting layer 30.

The quantum dot light-emitting layer 30 includes the heterodimer quantum dots, the heterodimer quantum dots include the first quantum dots carrying the positive charge and the second quantum dots carrying the negative charge, and each first quantum dot and each second quantum dot have a same energy gap. The first quantum dots and the second quantum dots are configured to emit light within a same wavelength range. In addition, each first quantum dot and each second quantum dot have different positions of conduction band and valence band. At this time, the holes migrate from the hole transport layer 20 to the quantum dot light-emitting layer 30 through a gradient energy level structure, so as to buffer and facilitate the hole injection, thereby to achieve the balance between the electrons and the holes, and improve the efficiency and the service life of the device.

In some embodiments of the present disclosure, the quantum dot light-emitting device further includes a base substrate 70, and the anode 10, the hole transport layer 20, the quantum dot light-emitting layer 30, the electron transport layer 40 and the cathode 50 are laminated one on another on the base substrate 70 in a direction away from the base substrate 70, or the cathode 50, the electron transport layer 40, the quantum dot light-emitting layer 30, the hole transport layer 20 and the anode 10 are laminated one on another on the base substrate 70 in a direction away from the base substrate 70.

In other words, the quantum dot light-emitting device further includes the base substrate 70. As shown in FIG. 1, the anode 10 is arranged on the base substrate 70, the hole transport layer 20 is arranged on the anode 10, the quantum dot light-emitting layer 30 is arranged on the hole transport layer 20, the electron transport layer 40 is arranged on the quantum dot light-emitting layer 30, and the anode 50 is arranged on the electron transport layer 40. Alternatively, as shown in FIG. 2, the cathode 50 is arranged on the base substrate 70, the electron transport layer 40 is arranged on the cathode 50, the quantum dot light-emitting layer 30 is arranged on the electron transport layer 40, and the hole transport layer 20 and the anode 10 are sequentially arranged on the quantum dot light-emitting layer 30, so as to facilitate the manufacture in different process orders. The structure in FIG. 1 is an inverted structure of that in FIG. 2.

In the quantum dot light-emitting element, a light-exiting mode is also set. For example, light emitted by the quantum dot light-emitting layer exits through the base substrate, or exits in a direction away from the base substrate.

For the structure in FIG. 1, the anode 10 and the base substrate 70 are transparent, and light is allowed to pass therethrough. The cathode 50 is made of metal, and light is not allowed to pass therethrough. Hence, the light exits through the base substrate at a bottom of the structure. In a mode where the light exits at a top, a reflector is arranged at the anode 10, and the cathode 50 is made of a transparent material, so as to allow the light to exit at the top, i.e., in the direction away from the base substrate. Whether the light exits at the bottom or top is described with respect to the base substrate 70. For example, when the light exits through the base substrate 70, it is in a mode where the light exits at the bottom of the structure.

In some embodiments of the present disclosure, the first quantum dot has a particle size of 1 nm to 10 nm, and the second quantum dot has a particle size of 1 nm to 10 nm. The particle size of the first quantum dot is identical to or different from the particle size of the second quantum dot, or the particle size of the first quantum dot approximates to the particle size of the second quantum dot, i.e., the particle sizes of the first quantum dot and the second quantum dot are selected according to the practical need.

In the embodiments of the present disclosure, the quantum dot light-emitting device further includes a hole injection layer 60 made of poly(3,4-ethylenedioxythiophene) (PEDOT): poly(sodium 4-styrenesulfonate) (PSS). The hole injection layer 60 is arranged between the anode 10 and the hole transport layer 20. The holes generated by the anode 10 migrate to the hole transport layer 20 through the hole injection layer 60, and then migrate to the quantum dot light-emitting layer 30. Through the hole injection layer 60 and the hole transport layer 20, it is able for the holes to be transported to the quantum dot light-emitting layer 30 efficiently.

As shown in FIG. 4, a work function of the anode 10 is −4.6 eV, and a work function of the cathode 50 is −4.3 eV. After the device has been energized, the electrons are transported from the cathode 50 to the quantum dot light-emitting layer 30 through the electron transport layer 40, and the holes are transported from the anode 10 to the quantum dot light-emitting layer 30 through the hole injection layer 60 and the hole transport layer 20. The holes and the electrons are finally combined in the quantum dot light-emitting layer 30 to emit light. The electron transport layer 40 (e.g., zinc oxide) has high electron mobility, so the electron injection is performed more efficiently than the hole injection. Through the introduction of the heterodimer quantum dots, a gradient energy level structure is provided between the hole transport layer 20 and the quantum dot, so as to facilitate the hole injection, improve the hole injection performance, and achieve a balance between the electrons and the holes, thereby to improve the efficiency and the service life of the device.

In some embodiments of the present disclosure, each of the first quantum dots and the second quantum dots includes one or more of a CdS/ZnS quantum dot, a CdSe/ZnS quantum dot, a CdS/ZnSe quantum dot, a CdSe/ZnSe quantum dot, an InP/ZnS quantum dot, a PbS/ZnS quantum dot, a $CsPbCl_3$/ZnS quantum dot or a $CsPbBr_3$/ZnSe quantum dot.

For example, the first quantum dot is a CdS/ZnS quantum dot and the second quantum dot is a CdSe/ZnS quantum dot; or the first quantum dot is a CdS/ZnSe quantum dot and the second quantum dot is a CdSe/ZnS quantum dot; or the first quantum dot is a CdS/ZnS quantum dot and the second quantum dot is a CdSe/ZnSe quantum dot; or the first quantum dot is a CdS/ZnS quantum dot and the second quantum dot is a CdS/ZnS quantum dot; or the first quantum dot is an InP/ZnS quantum dot and the second quantum dot is an InP/ZnS quantum dot; or the first quantum dot is a PbS/ZnS quantum dot and the second quantum dot is a CdS/ZnSe quantum dot; or the first quantum dot is a $CsPbCl_3$/ZnS quantum dot and the second quantum dot is a $CsPbBr_3$/ZnSe quantum dot. The first quantum dot and the second quantum dot are selected according to the practical need.

In some other embodiments of the present disclosure, the first quantum dot in the quantum dot light-emitting layer 30 carries a cationic surfactant. Through the cationic surfactant, the first quantum dot in the quantum dot light-emitting layer 30 carries the positive charge. The second quantum dot in the quantum dot light-emitting layer 30 carries an anionic surfactant. Through the anionic surfactant, the second quantum dot in the quantum dot light-emitting layer 30 carries the negative charge. Through the ionic surfactant, it is able for the first quantum dot and the second quantum dot to carry the charges easily, and meanwhile it is able to wash the ionic surfactant easily. Through the positive charge and the negative charge, it is able to attract the first quantum dot and the second quantum dot.

The present disclosure further provides in some embodiments a method for preparing a heterodimer quantum dot, which includes: acquiring first quantum dots and second quantum dots, each first quantum dot and each second quantum dot having a same energy gap and different positions of conduction band and valence band; enabling each first quantum dot to carry a positive charge and enabling each second quantum dot to carry a negative charge; and mixing the first quantum dots carrying the positive charge and the second quantum dots carrying the negative charge to acquire the heterodimer quantum dot.

According to the method for preparing the heterodimer quantum dot in the embodiments of the present disclosure, the prepared heterodimer quantum dots include the first quantum dots carrying the positive charge and the second quantum dots carrying the negative charges, and each first quantum dot and each second quantum dot have a same energy gap and different positions of conduction band and valence band. When the heterodimer quantum dot is applied to a quantum dot light-emitting device, the holes migrate from a hole transport layer to the quantum dot light-emitting layer through a gradient energy level structure, so as to buffer and facilitate the hole injection, thereby to achieve the balance between the electrons and the holes, and improve the efficiency and the service life of the device.

In some embodiments of the present disclosure, the enabling each first quantum dot to carry the positive charge and enabling each second quantum dot to carry the negative charge includes: forming a colloid of the first quantum dots, and adding a cationic surfactant into the colloid of the first quantum dots to acquire the first quantum dots carrying the positive charge; and forming a colloid of the second quantum dots, and adding an anionic surfactant into the colloid of the second quantum dots to acquire the second quantum dots carrying the negative charge.

The cationic surfactant is one or more of octadecyl trimethyl ammonium chloride, dodecyl dimethyl benzyl ammonium bromide, and N,N-dimethyl dodecylamine. The anionic surfactant is one or more of sodium alcohol ether sulphate and sulfonates of ethoxylated fatty acid methyl ester. The other ionic surfactants may also be selected as the cationic surfactant and the anionic surfactant according to the practical need.

In some embodiments of the present disclosure, the acquiring the first quantum dots and the second quantum dots includes: forming the first quantum dots carrying a first elementary composition in a first synthesis condition; and forming the second quantum dots carrying a second elementary composition in a second synthesis condition. Elements in the first elementary composition are the same as elements in the second elementary composition, or at least one element in the first elementary composition is different from the elements in the second elementary composition.

In an actual procedure, the quantum dot is prepared on the basis of a core-shell quantum dot e.g., CdSe/ZnS. Each of the first quantum dots and the second quantum dots is synthesized by using a conventional quantum dot synthesis method. Through adjusting the synthesis conditions and the compositions of the quantum dots, i.e., adjusting the first synthesis condition, the second synthesis condition, the first elementary composition and the second elementary composition, it is able to control the first quantum dot and the second quantum dot to have a same energy gap and different positions of conduction band and valence band. The elements in the first elementary composition are the same as elements in the second elementary composition, or at least one element in the first elementary composition is different from the elements in the second elementary composition, which may be selected according to the practical need. For example, when the first quantum dot is a CdS/ZnS quantum dot and the second quantum dot is a CdS/ZnS quantum dot, the elements in the first elementary composition are the same as elements in the second elementary composition. For example, a difference between the first synthesis condition and the second synthesis condition lies in different temperatures for the synthesis.

During the preparation, the colloid of the first quantum dots is formed at first, and then the cationic surfactant is added into the colloid of the first quantum dots, to acquire the first quantum dots carrying the positive charge. Next, the colloid of the second quantum dots is formed, and then the anionic surfactant is added into the colloid of the second quantum dots, to acquire the second quantum dots carrying the negative charge.

The first quantum dots carrying the positive charge and the second quantum dots carrying the negative charge are transferred to a flask at a predetermined proportion, and stirred under the effect of a magnetic force for a predetermined time period, so as to sufficiently and uniformly mix the first quantum dots and the second quantum dots. Due to the mutual attraction between the positive and negative charges, the first quantum dots and the second quantum dots are combined together.

In some embodiments of the present disclosure, the method further includes washing and purifying the heterodimer quantum dots.

In the process of enabling the quantum dots to carry charges, the heterodimer quantum dots carry the surfactant, so as to wash and purify the heterodimer quantum dots centrifugally during the preparation of the device, thereby to remove the excessive ionic surfactant in the heterodimer quantum dots.

The present disclosure further provides in some embodiments a method for preparing a quantum dot light-emitting device, which includes forming an anode 10, a hole transport layer 20, a quantum dot light-emitting layer 30, an electron transport layer 40 and a cathode 50 laminated one on another. The quantum dot light-emitting layer 30 includes heterodimer quantum dots, the heterodimer quantum dots include first quantum dots carrying a positive charge and second quantum dots carrying a negative charge, and each first quantum dot and each second quantum dot have a same energy gap and different positions of conduction band and valence band.

According to the method in the embodiments of the present disclosure, the first quantum dot and the second quantum dot have a same energy gap, and the first quantum dots and the second quantum dots are configured to emit light within a same wavelength range. In addition, the first quantum dot and the second quantum dot have different positions of conduction band and valence band. At this time, the holes migrate from the hole transport layer 20 to the quantum dot light-emitting layer 30 through a gradient energy level structure, so as to buffer and facilitate the hole injection, thereby to achieve the balance between the electrons and the holes, and improve the efficiency and the service life of the device.

In some embodiments of the present disclosure, the forming the anode 10, the hole transport layer 20, the quantum dot light-emitting layer 30, the electron transport layer 40 and the cathode 50 laminated one on another includes: providing a base substrate 70, and forming the anode 10, the hole transport layer 20, the quantum dot light-emitting layer 30, the electron transport layer 40 and the cathode 50 laminated one on another on the base substrate 70; or providing a base substrate 70, and forming the cathode 50, the electron transport layer 40, the quantum dot light-emitting layer 30, the hole transport layer 20 and the anode 10 laminated one on another on the base substrate 70.

In other words, the quantum dot light-emitting device is manufactured in different process orders. For example, in some embodiments of the present disclosure, the base substrate 70 is provided, and then the anode 10, the hole transport layer 20, the quantum dot light-emitting layer 30, the electron transport layer 40 and the cathode 50 are sequentially formed on the base substrate 70. Alternatively, in some other embodiments of the present disclosure, the base substrate 70 is provided, and then the cathode 50, the electron transport layer 40, the quantum dot light-emitting layer 30, the hole transport layer 20 and the anode 10 are sequentially formed on the base substrate 70. In actual use, different methods are selected according to the practical need.

Before the use of the base substrate 70, the base substrate 70 is washed and dried. The base substrate 70 is transparent, e.g., it is a transparent glass substrate. The anode 10 is made of ITO, and the holes are generated through the anode 10. The hole transport layer 20, the quantum dot light-emitting layer 30 and the electron transport layer 40 are formed through spinning. The electron transport layer 40 is a layer made of ZnO nanoparticles. The cathode 50 is formed through evaporation. The cathode 50 is made of aluminium (Al) and has a thickness of 500 nm to 1000 nm. After the formation of the cathode 50 through evaporation, the device is encapsulated.

In some embodiments of the present disclosure, the hole transport layer 20, the quantum dot light-emitting layer 30, the electron transport layer 40 and the cathode 50 are formed through ink-jet printing, or any other process selected according to the practical need.

In the embodiments of the present disclosure, the forming the anode 10, the hole transport layer 20, the quantum dot light-emitting layer 30, the electron transport layer 40 and the cathode 50 laminated one on another includes forming the anode 10, a hole injection layer 60, the hole transport layer 20, the quantum dot light-emitting layer 30, the electron transport layer 40 and the cathode 50 laminated one on another.

In the embodiments of the present disclosure, the forming the anode 10, the hole transport layer 20, the quantum dot light-emitting layer 30, the electron transport layer 40 and the cathode 50 laminated one on another includes forming the cathode 50, the electron transport layer 40, the quantum dot light-emitting layer 30, the hole transport layer 20, the hole injection layer 60 and the anode 10 laminated one on another.

The hole injection layer 60 is formed between the anode 10 and the hole transport layer 20 by using different methods, so as to facilitate the migration of the holes to the quantum dot light-emitting layer 30 through the hole injection layer 60 and the hole transport layer 20. The hole injection layer 60 is formed through spinning, and it is made of PEDOT:PSS.

In some embodiments of the present disclosure, the first quantum dots and the second quantum dots are configured to emit light within a same wavelength range.

In some embodiments of the present disclosure, the first quantum dot has a particle size of 1 nm to 10 nm, and the second quantum dot has a particle size of 1 nm to 10 nm. Specific particle sizes of the first quantum dot and the second quantum dot are selected according to the practical need.

The hole injection layer 60, the quantum dot light-emitting layer 30, the electron transport layer 40 and the cathode 50 are formed through ink-jet printing, or any other process selected according to the practical need.

In some embodiments of the present disclosure, each of the first quantum dots and the second quantum dots includes one or more of a CdS/ZnS quantum dot, a CdSe/ZnS quantum dot, a CdS/ZnSe quantum dot, a CdSe/ZnSe quantum dot, an InP/ZnS quantum dot, a PbS/ZnS quantum dot, a CsPbCl$_3$/ZnS quantum dot or a CsPbBr$_3$/ZnSe quantum dot.

For example, the first quantum dot is a CdS/ZnS quantum dot and the second quantum dot is a CdSe/ZnS quantum dot; or the first quantum dot is a CdS/ZnSe quantum dot and the second quantum dot is a CdSe/ZnS quantum dot; or the first quantum dot is a CdS/ZnS quantum dot and the second quantum dot is a CdSe/ZnSe quantum dot; or the first quantum dot is a CdS/ZnS quantum dot and the second quantum dot is a CdS/ZnS quantum dot; or the first quantum dot is an InP/ZnS quantum dot and the second quantum dot is an InP/ZnS quantum dot; or the first quantum dot is a PbS/ZnS quantum dot and the second quantum dot is a CdS/ZnSe quantum dot; or the first quantum dot is a CsPbCl$_3$/ZnS quantum dot and the second quantum dot is a CsPbBr$_3$/ZnSe quantum dot. The first quantum dot and the second quantum dot are selected according to the practical need.

In some other embodiments of the present disclosure, the first quantum dot in the quantum dot light-emitting layer 30 carries a cationic surfactant. Through the cationic surfactant, the first quantum dot in the quantum dot light-emitting layer 30 carries the positive charge. The second quantum dot in the quantum dot light-emitting layer 30 carries an anionic surfactant. Through the anionic surfactant, the second quantum dot in the quantum dot light-emitting layer 30 carries the negative charge.

Through the ionic surfactant, it is able for the first quantum dot and the second quantum dot to carry the charges easily, and meanwhile it is able to wash the ionic surfactant easily. Through the positive charge and the negative charge, it is able to combine the first quantum dot and the second quantum dot together through attraction.

The present disclosure further provides in some embodiments a display device including the above-mentioned quantum dot light-emitting device. Because the display device includes the quantum dot light-emitting device, when the efficiency and the service life of the quantum dot light-emitting device are improved, it is also able to improve the efficiency and the service life of the display device.

Unless otherwise defined, any technical or scientific term used herein shall have the common meaning understood by a person of ordinary skills. Such words as "first" and "second" used in the specification and claims are merely used to differentiate different components rather than to represent any order, number or importance. Such words as "include" or "including" intends to indicate that an element or object before the word contains an element or object or equivalents thereof listed after the word, without excluding any other element or object. Such words as "connect/connected to" or "couple/coupled to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The above embodiments are for illustrative purposes only, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. A quantum dot light-emitting device, comprising an anode, a hole transport layer, a quantum dot light-emitting layer, an electron transport layer and a cathode laminated one on another, wherein the quantum dot light-emitting layer comprises heterodimer quantum dots, the heterodimer quantum dots comprise first quantum dots carrying a positive charge and second quantum dots carrying a negative charge, and each first quantum dot and each second quantum dot have a same energy gap and different positions of conduction band and valence band;

wherein each first quantum dot in the quantum dot light-emitting layer carries a cationic surfactant, and each second quantum dot in the quantum dot light-emitting layer carries an anionic surfactant.

2. The quantum dot light-emitting device according to claim 1, further comprising a base substrate, wherein the anode, the hole transport layer, the quantum dot light-emitting layer, the electron transport layer and the cathode are laminated one on another on the base substrate in a direction away from the base substrate.

3. The quantum dot light-emitting device according to claim 1, further comprising a base substrate, wherein the cathode, the electron transport layer, the quantum dot light-emitting layer, the hole transport layer and the anode are laminated one on another on the base substrate in a direction away from the base substrate.

4. The quantum dot light-emitting device according to claim 1, wherein the first quantum dots and the second quantum dots are configured to emit light within a same wavelength range.

5. The quantum dot light-emitting device according to claim 1, further comprising a hole injection layer arranged between the anode and the hole transport layer.

6. The quantum dot light-emitting device according to claim 1, wherein each of the first quantum dots and the second quantum dots comprises one or more of a CdS/ZnS quantum dot, a CdSe/ZnS quantum dot, a CdS/ZnSe quantum dot, a CdSe/ZnSe quantum dot, an InP/ZnS quantum dot, a PbS/ZnS quantum dot, a $CsPbCl_3$/ZnS quantum dot or a $CsPbBr_3$/ZnSe quantum dot.

7. The quantum dot light-emitting device according to claim 2, wherein light emitted by the quantum dot light-emitting layer exits through the base substrate, or exits in a direction away from the base substrate.

8. A display device, comprising the quantum dot light-emitting device according to claim 1.

9. A method for preparing a heterodimer quantum dot, comprising:
   acquiring first quantum dots and second quantum dots, each first quantum dot and each second quantum dot having a same energy gap and different positions of conduction band and valence band;
   enabling each first quantum dot to carry a positive charge and enabling each second quantum dot to carry a negative charge; and
   mixing the first quantum dots carrying the positive charge and the second quantum dots carrying the negative charge to acquire the heterodimer quantum dot;
   wherein the enabling each first quantum dot to carry the positive charge and enabling each second quantum dot to carry the negative charge comprises:
   forming a colloid of the first quantum dots, and adding a cationic surfactant into the colloid of the first quantum dots to acquire the first quantum dots carrying the positive charge; and
   forming a colloid of the second quantum dots, and adding an anionic surfactant into the colloid of the second quantum dots to acquire the second quantum dots carrying the negative charge.

10. The method according to claim 9, wherein the acquiring the first quantum dots and the second quantum dots comprises:
    forming the first quantum dots carrying a first elementary composition in a first synthesis condition; and
    forming the second quantum dots carrying a second elementary composition in a second synthesis condition,
    wherein elements in the first elementary composition are the same as elements in the second elementary composition, or at least one element in the first elementary composition is different from the elements in the second elementary composition.

11. The method according to claim 9, wherein the method further comprises washing and purifying the heterodimer quantum dots.

12. A method for preparing a quantum dot light-emitting device, comprising forming an anode, a hole transport layer, a quantum dot light-emitting layer, an electron transport layer and a cathode laminated one on another, wherein the quantum dot light-emitting layer comprises heterodimer quantum dots, the heterodimer quantum dots comprise first quantum dots carrying a positive charge and second quantum dots carrying a negative charge, and each first quantum dot and each second quantum dot have a same energy gap and different positions of conduction band and valence band;
    wherein each first quantum dot in the quantum dot light-emitting layer carries a cationic surfactant, and each second quantum dot in the quantum dot light-emitting layer carries an anionic surfactant.

13. The method according to claim 12, wherein the forming the anode, the hole transport layer, the quantum dot light-emitting layer, the electron transport layer and the cathode laminated one on another comprises providing a base substrate, and forming the anode, the hole transport layer, the quantum dot light-emitting layer, the electron transport layer and the cathode laminated one on another on the base substrate.

14. The method according to claim 12, wherein the forming the anode, the hole transport layer, the quantum dot light-emitting layer, the electron transport layer and the cathode laminated one on another comprises providing a base substrate, and forming the cathode, the electron transport layer, the quantum dot light-emitting layer, the hole transport layer and the anode laminated one on another on the base substrate.

15. The method according to claim 12, wherein the first quantum dots and the second quantum dots are configured to emit light within a same wavelength range.

16. The method according to claim 12, wherein the forming the anode, the hole transport layer, the quantum dot light-emitting layer, the electron transport layer and the cathode laminated one on another comprises forming the anode, a hole injection layer, the hole transport layer, the quantum dot light-emitting layer, the electron transport layer and the cathode laminated one on another.

17. The method according to claim 12, wherein the forming the anode, the hole transport layer, the quantum dot light-emitting layer, the electron transport layer and the cathode laminated one on another comprises forming the cathode, the electron transport layer, the quantum dot light-emitting layer, the hole transport layer, a hole injection layer and the anode laminated one on another.

18. The method according to claim 12, wherein each of the first quantum dots and the second quantum dots comprises one or more of a CdS/ZnS quantum dot, a CdSe/ZnS quantum dot, a CdS/ZnSe quantum dot, a CdSe/ZnSe quantum dot, an InP/ZnS quantum dot, a PbS/ZnS quantum dot, a $CsPbCl_3$/ZnS quantum dot or a $CsPbBr_3$/ZnSe quantum dot.

* * * * *